(12) United States Patent
Choi et al.

(10) Patent No.: US 11,315,764 B2
(45) Date of Patent: Apr. 26, 2022

(54) STRUCTURE VARIABLE TYPE OF A PLASMA SOURCE COIL AND A METHOD FOR CONTROLLING THE SAME

(71) Applicant: Adaptive Plasma Technology Corp., Icheon-si (KR)

(72) Inventors: Woo Hyung Choi, Seongnam-si (KR); Sang Woo Lee, Suwon-si (KR)

(73) Assignee: ADAPTIVE PLASMA TECHNOLOGY CORP., Icheon-si (KR)

( * ) Notice: Subject to any disclaimer, the term of this patent is extended or adjusted under 35 U.S.C. 154(b) by 0 days.

(21) Appl. No.: 17/015,520

(22) Filed: Sep. 9, 2020

(65) Prior Publication Data

US 2021/0335583 A1  Oct. 28, 2021

(30) Foreign Application Priority Data

Apr. 28, 2020  (KR) ........................ 10-2020-0051158

(51) Int. Cl.
*H01J 37/32* (2006.01)
*H01L 21/67* (2006.01)

(52) U.S. Cl.
CPC ..... *H01J 37/32568* (2013.01); *H01J 37/3211* (2013.01); *H01J 37/3299* (2013.01); *H01J 2237/3344* (2013.01); *H01L 21/67069* (2013.01)

(58) Field of Classification Search
CPC ............. H01J 37/3211; H01J 37/32183; H01J 37/32174; H01J 37/32669; H01J 37/32724
See application file for complete search history.

(56) References Cited

U.S. PATENT DOCUMENTS

| | | | | |
|---|---|---|---|---|
| 6,093,457 A | * | 7/2000 | Okumura | .............. H01J 37/321 427/569 |
| 6,361,644 B1 | * | 3/2002 | Collins | .................. H01J 37/321 118/723 I |
| 2008/0168945 A1 | * | 7/2008 | Kim | ........................ H05H 1/46 118/723 I |
| 2010/0282597 A1 | * | 11/2010 | Kim | ...................... H01J 37/321 204/164 |
| 2020/0219698 A1 | * | 7/2020 | Ye | ....................... H01L 21/6833 |

FOREIGN PATENT DOCUMENTS

| | | |
|---|---|---|
| KR | 100519677 | 9/2005 |
| WO | 2017189234 | 11/2017 |

* cited by examiner

*Primary Examiner* — Tung X Le
(74) *Attorney, Agent, or Firm* — Cantor Colburn LLP

(57) ABSTRACT

Provided is a structure variable type of a plasma source coil and a method for controlling the same. The plasma source coil comprises a plurality of coil branches extending in a spiral shape based on a central part, wherein at least one coil branch has a structure in which the extending direction or a tilting level can be adjusted.

1 Claim, 5 Drawing Sheets

STRUCTURE VARIABLE TYPE OF A PLASMA SOURCE COIL AND A METHOD FOR CONTROLLING THE SAME

BACKGROUND OF THE INVENTION

1. Field of the Invention

The present invention relates to a structure variable type of a plasma source coil and a method for controlling the same, in particular relates to the plasma source coil to have a changeable structure for distributing a plasma on a whole surface of a wafer uniformly and the method for controlling the plasma source coil to distribute the plasma uniformly on the surface of the wafer.

2. Description of the Related Art

A plasma source coil to generating a plasma is a main apparatus to affect a plasma density and a uniformity of the plasma density in an etching process of a semiconducting facility using the plasma. The plasma density may be a main factor to determine an etching process rate and a uniform property of the process product, but it is difficult for a uniform distribution of the plasma on all of a wafer surface in different processing conditions. Various inventions for controlling a generating property of the plasma are known in this art. Korean Patent Registration No. 10-0519677 discloses a plasma processing apparatus for controlling a disproportion of a plasma processing. And also, WO 2017/189234 discloses a VHF Z-coil plasma source for providing a high density plasma ion to improve a semiconductor processing capacity and productivity. As the semiconductor process becomes finer and more advanced, it is an important issue to ensure a uniform result of the semiconductor process. But the prior art doesn't disclose an apparatus or a method to obtain a uniform result in different processing conditions.

PURPOSE OF THE INVENTION

An object of the present invention is to provide with a plasma source coil for adjusting a geometric structure to control a distributing characteristic of a plasma density and a method for regulating the same.

SUMMARY OF THE INVENTION

In one embodiment of the present invention, a structure variable type of a plasma source coil comprises a plurality of coil branches extending in a spiral shape based on a central part, wherein at least one coil branch has a structure in which the extending direction or a tilting level can be adjusted.

In other embodiment of the present invention, the plasma source coil further comprises an adjusting guide formed in the direction of the at least one coil branch.

In another embodiment of the present invention, the at least one coil branch is rotated in a clockwise or count clockwise direction for adjusting the extending direction or the tilting level.

In still another embodiment of the present invention, a gap size is adjusted by the extending direction or the tilting level.

In still another embodiment of the present invention, a method for adjusting a geometric structure of a plasma source coil comprises arranging a plasma source coil; detecting a plasma density generated the plasma source coil on a predetermined plane or obtaining a plasma density data on the plane; and adjusting a extending direction of at least one branch of the plasma source coil or a tilting level of the at least one branch based on the plasma density on the plane.

In still another embodiment of the present invention the predetermined plane is a wafer surface fixed in a processing chamber.

DETAILED DESCRIPTION OF EXEMPLARY EMBODIMENTS

Exemplary embodiments of the present invention will be described herein below with reference to the accompanying drawings.

Figure 1A:
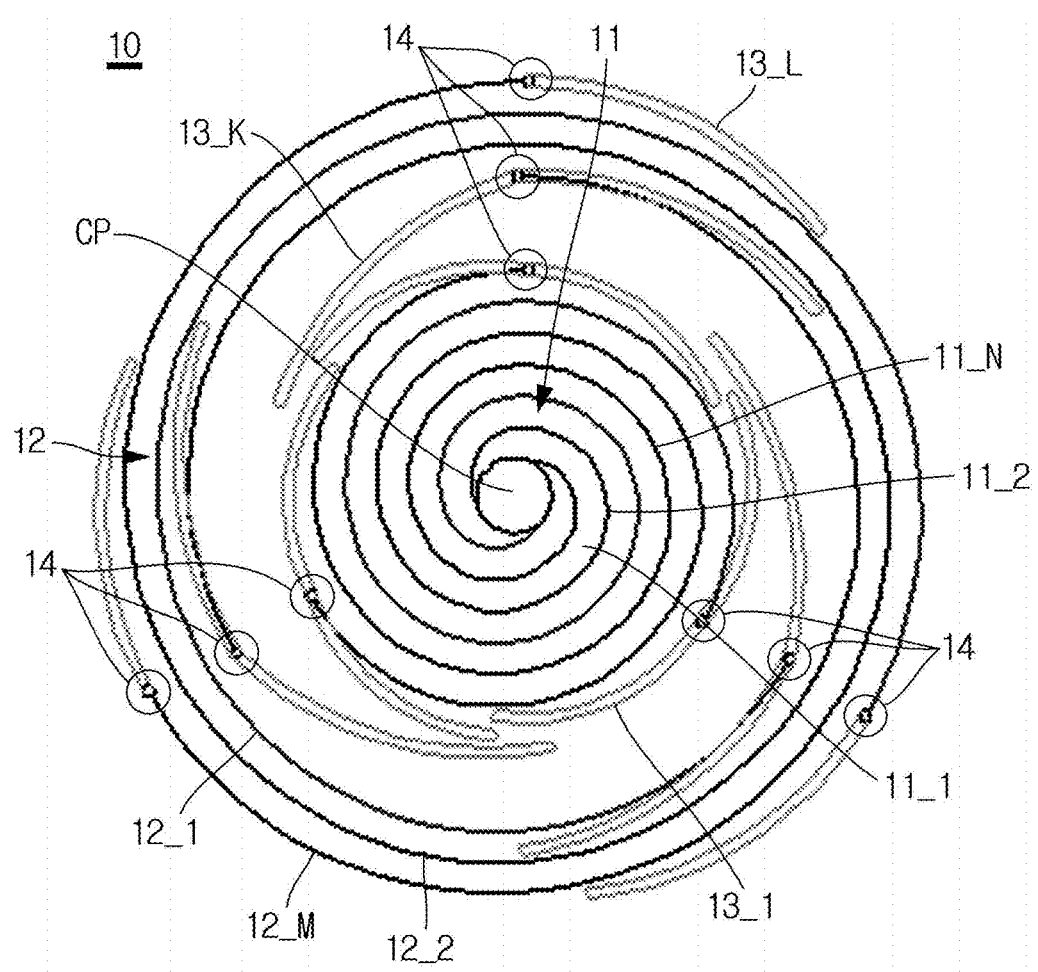
FIG. 1a and FIG. 1b show an exemplary embodiment of a plasma source coil accord to the present invention.
Figure 1B:
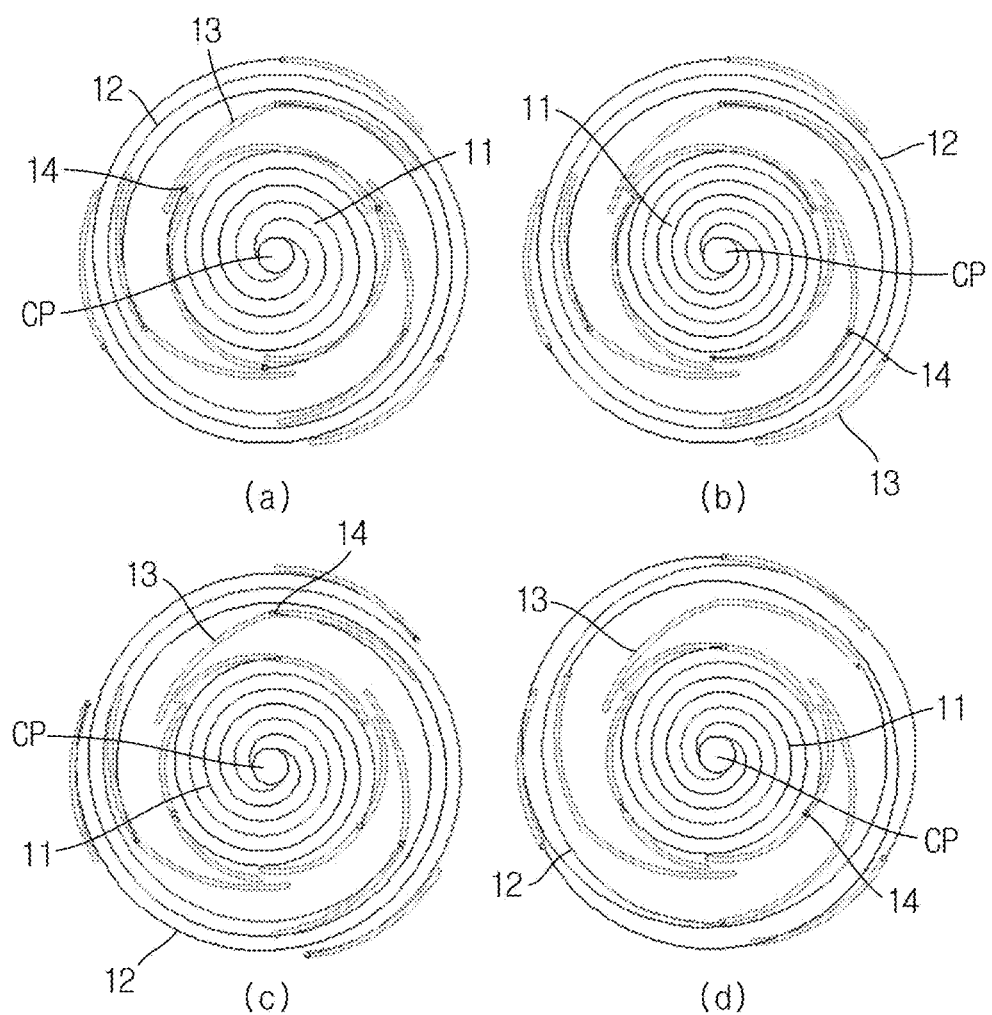

FIG. 1a and FIG. 1b show an exemplary embodiment of a plasma source coil accord to the present invention.

Referring to FIG. 1a and FIG. 1b, a structure variable type of a plasma source coil comprises a plurality of coil branches 11_1 to 12_M extending in a spiral shape based on a central part PC, wherein at least one coil branch 11_1 to 12_M has a structure in which the extending direction or a tilting level can be adjusted.

The plasma source coil 10 may be a coil to generate a plasma by supplying a RF power to a plasma source. The plasma source may have a structure such as a TCP (Transformer Coupled Plasma), ICP (Inductively Coupled Plasma), HP (Helicon Plasma) or the like, not limited to. And also, the plasma source can supply the plasm to various semiconductor processes including an etching process. The source coil 10 comprises a plurality of coil branches 11_1 to 12_M, and each coil branch 11_1 to 12_M extends in a spiral shape. Each spiral shape may be a same or similar geometric structure, or one spiral shape may be different from other. A regulation of the source coil 10 may include a total size regulation, a tilting level regulation or a form regulation. Each coil branch 11_1 to 12_M may be adjusted or regulated in a manner that a direction or the tilting angle of each coil branch 11_1 to 12_M is changed. One coil branch 11_1 to 12_M may extend in a length different from that of the other based on an identical point such as the central part CP. Or one coil branch 11_1 to 12_M may extend along spiral path having a length similar to or different from that of the other coil branch 11_1 to 12_M based on an identical point or on different points each other. For example, the source coil 10 may comprise a central source coil 11 and an edge source coil 12. The central source coil 11 may comprise a plurality of central coil branches 11_1 to 12_M extending from the central part CP, while the edge source coil 12 may be arranged around the central source coil 11 and may comprise a plurality of edge coil branches extending from different points. The central source coil 11 or edge source coil 12 may be adjusted as a whole. Or each coil branch 11_1 to 12_M) may be adjusted independently. At least one adjusting guide 13_1 to 13_L for adjusting at least one coil branch 11_1 to 12_M. Each adjusting guide 13_1 to 13_L may guide each coil branch 11_1 to 12_M, and each coil branch 11_1 to 12_M may rotate in a clockwise or count clockwise direction by the adjusting guide 13_1 to 13_L. Each adjusting guide 13_1 to 13_L may have a structure to extend in spiral shape, and each end part of each coil branch 11_1 to 12_M may contact at one point of each adjusting guide 13_1 to 13_L. Each adjusting guide 13_1 to 13_L may have various structures to guide the coil branch 11_1 to 12_M, and, for example, each adjusting guide 13_1 to 13_L may have a spiral wall shape to protrude upwardly from a fixing plane where the coil branch 11_1 to 11_M is arranged. Or each adjusting guide 13_1 to 13_L may have a tube or a semi-tube shape where each coil branch 11_1 to 12_M can be inserted to guide. Or each adjusting guide 13_1 to 13_L may have a guiding groove to guide each branch coil 11_1 to 12_M along spiral direction. Each adjusting guide 13_1 to 13_L may have various structure to rotate each coil branch 11_1 to 12_M along clockwise or count-clockwise direction, not limited to. Each adjusting guide 13_1 to 13_L may extend in a different shape, respectively, and the extending shape may be transformed. Specifically, the shape of the source coil 10 may be adjusted according to a kind of a process, a process condition or a condition to generate a plasma. Each coil branch 11_1 to 12_M may have a contacting point 14 at the adjusting guide 13_1 to 13_L, and the contacting point 14 may move along the adjusting guide 13_1 to 13_L. And the shape of the source coil 10 may be adjusted, as each coil branch 11_1 to 12_M) may rotate along the adjusting guide 13_1 to 13_L. The shape of the source coil 10 may be changed as following, as shown in FIG. 1b.

If the central coil 11 is rotated in the count-clockwise direction along the adjusting guide 13_1 to 13_L, then a central coil area and a gap distance between the central coil branches 11_1 to 11_N may increase and a separating distance to the edge coil 12 may decrease. Accordingly, an inductance of the central coil 11 may decrease and the plasma density at the central part CP may decrease. And also, an effect to the edge coil 12 may increase, as the relative distance decreases.

If the central coil 11 is rotated in a clockwise direction along the adjusting guide 13_1 to 13_L, then the central coil area and the gap distance between the central coil branches 11_1 to 11_N may decrease and the relative distance to the edge coil 12 may increase. Accordingly, the inductance of the central coil 11 may increase and the plasma density of the central part PC may increase. And also, the effect of the edge coil 12 to the central coil 11 may decrease.

If the edge coil 12 is rotated along the adjusting guide 13_1 to 13_L, an edge coil area may decrease and a gap distance between the edge coil branches may decrease. Accordingly, a plasma density at an edge part may increase. Selectively, a relative distance to the central coil 11 may maintain at a constant range and the gap distance between the edge coil branches 12_1 to 12_M is regulated. Hence, the plasma density at the central part PC may maintain at a constant range, while the plasma density at the edge part may be regulated.

The edge coil is rotated in the clockwise direction along the adjusting guide 13_1 to 13_L, then the edge coil area 12 and the gap distance between the edge coil branches 12_1 to 12_M may decrease and the relative distance to the central coil 12 may decrease. Accordingly, the inductance of the edge coil may increase to induce higher plasma density at the edge part, and the effect by the central coil 11 may decrease, as the relative distance to the central coil decreases.

Furthermore, if the edge coil is rotated in the count-clockwise along the adjusting guide 13_1 to 13_L, the edge coil area may decrease to induce the increased gap distance. Accordingly, the inductance of the edge coil 12 decrease, and the effect by the central coil 11 may increase, as decreasing to the central coil 11.

As mentioned above, the central coil 11 may have three adjusting ways such as the fixing location, the clockwise rotation and the count-clockwise rotation, and the edge coil 12 has the same ways as the central coil does. In addition, the edge coil 12 may have additional two adjusting ways. For example, the edge coil 12 may be fixed as a whole, or the edge coil 12 may be rotated in an outward direction. Even though, in the above example, eighteen adjusting locations may be set, various adjusting locations or adjusting angle may be set according to the structure of the central coil 11 or the edge coil 12, not limited to.

The central coil 11 or the edge coil 12 may be regulated by various ways or means. For example, the central coil 11 or the edge coil 12 may be rotated by a driving means such as a motor to control a rotating angle. An end part of each coil branch 11_1 to 12_M) to be rotated may be secured a rotatable circular board, and the circular board may be rotated at a predetermined angle by the motor to rotate the coil branch 11_1 to 12_M. The central coil 11 or the edge coil 12 may be rotated by various driving means, not limited to.

Figure 2:
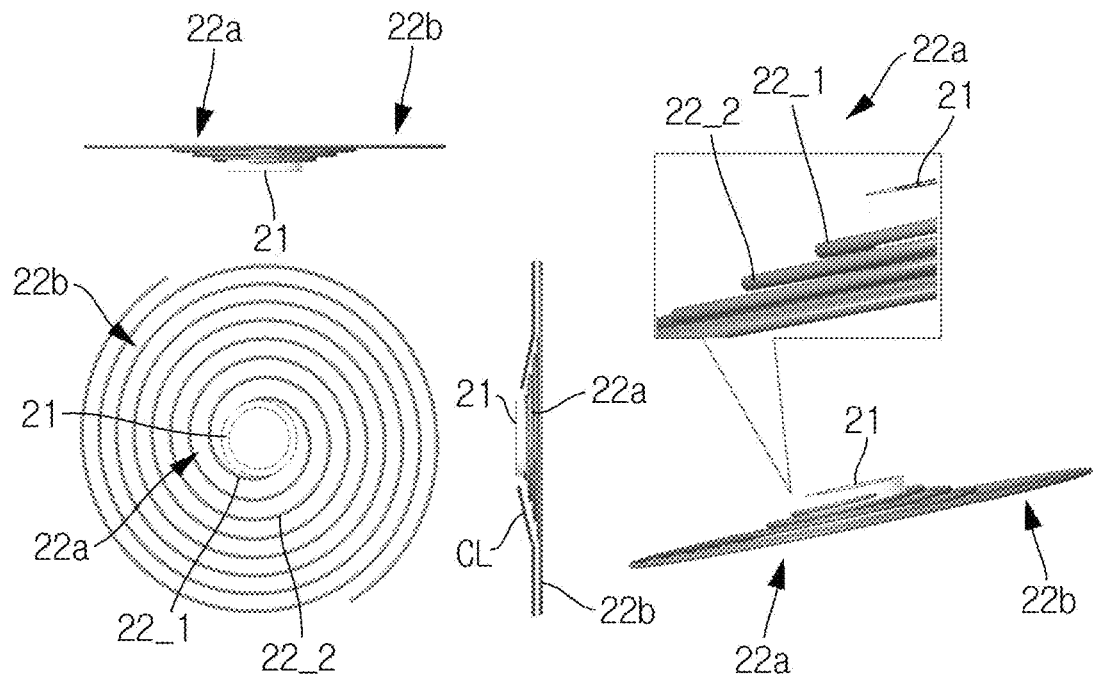
FIG. 2 shows other exemplary embodiment of a plasma source coil according to the present invention.

FIG. 2 shows other exemplary embodiment of a plasma source coil according to the present invention.

Referring to FIG. 2, the plasma source coil may comprise a bushing 21 displaced at the central part; and coil branch 22_1, 22_2 extending in a spiral shape from different locations of the bushing 21. The coil branch 22_1, 22_2 may be one or more, not limited to. A tiling level of each coil branch 22_1 22_2 may be adjusted, or an extending direction or a gap distance between the coil branches 22_1, 22_2 may be adjusted. One coil branch 22_1 or 22_2 may extend along a spiral path as the height from a fixing surface or a reference surface varies along the path for regulating the tilting level. For example, as shown in the right part, one portion of the coil branch 22_1 or 22_2 near to the bushing 21 may have higher height from the reference surface, while the other portion of the coil branch 22_1 or 22_2 far from the bushing 21 may be adjusted to have a suitable height or may be not adjusted. Accordingly, the plasma source coil may have a geometric structure that is tilted as a whole from the central part located at the bushing 21 to a peripheral part. Or, for example, a portion of the coil branch 22_1, or 22_2 arranged in a predetermined radius range from the bushing 21 may be adjusted for regulating a partial tilting level. As a result of the partial tilting regulation, the plasma source coil may comprise a tilted coil part 22a and a flat coil part 22b. For example, the tilted coil part 22a may extend as the height becomes lower from the bushing 21, hence the first coil branch 22_1 extending in the spiral shape with different radii along the extending path may have different heights. And also, a height of the second coil branch 22_2 may become different from that of the first coil branch 22_1, having different heights along the radius. Accordingly, a side height line CL of the total plasma source coil adjusted partially with the tilting level may consist of a tilting line part and a horizontal line part, and the tilting line part and the horizontal line may be adjusted properly according to the total structure of the plasma source coil or a process step. Each coil branch 22_1, 22_2 may extend having a constant or different separating distance relative to an adjacent part. And also, different coil branches 22_1, 22_2 may extend with the separating distance constant, and the separate distance may be adjusted between the different coil branches 22_1, 22_2 according to the present invention.

Figure 3:
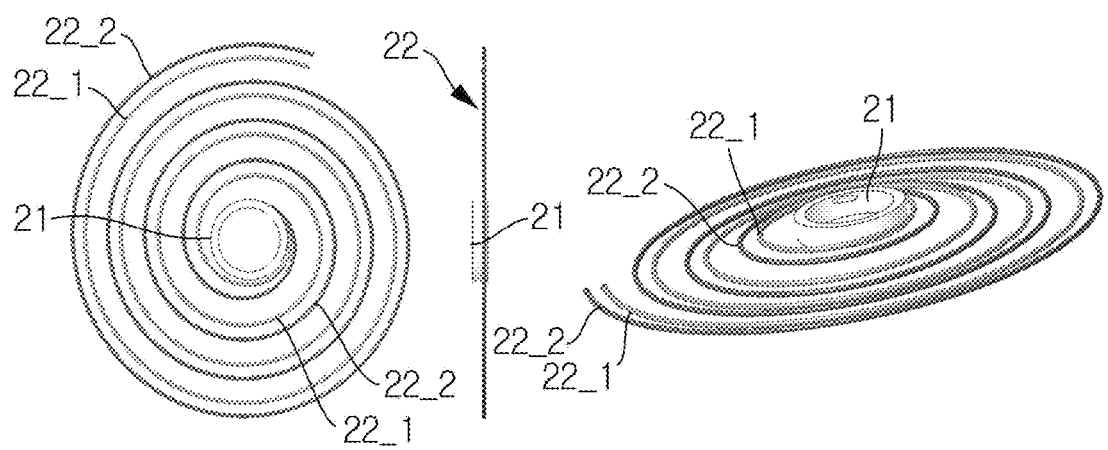
FIG. 3 shows an exemplary embodiment adjusting a structure of the plasma source coil according to the present invention.

FIG. 3 shows an exemplary embodiment adjusting a structure of the plasma source coil according to the present invention.

Referring to FIG. 3, Each coil branch 22_1, 22_2 comprised in the plasma source coil may extend from different parts of the bushing 21 to have different separating distance along the radius. The different coil branches 22_1, 22_2 may have an identical or similar separating distance along the radius in the example with regard to FIG. 2. On the other hand, the different coil branches 22_1, 22_2 may extend having different separating distances repeatedly along the radius as shown in FIG. 3. In addition, each coil branch 22_1, 22_2 may be tilted along the extending direction. The separating distance between the different coil branches 22_1, 22_2, a selection of tilting or not along the extending direction or a tilting level may be determined properly depending on a process recipe. And the selection may be made as various ways in different processes based on forming an uniform plasma density on all of the wafer surface. The separating distance or the tilting lever may be controlled precisely by controlling a rotating angle of a motor. For example, at least one part of each coil branch 22_1, 22_2 may be secured to be rotated at a predetermined angle range by the rotation of the motor, hence the separating distance between the coil branches 22_1, 22_2 or the tilting level may be adjusted. And a magnetic field induced by each coil branch 22_1, 22_2 on the wafer surface may be controlled by the adjustment of the separating distance or tilting level to control the plasma generation.

Figure 4:
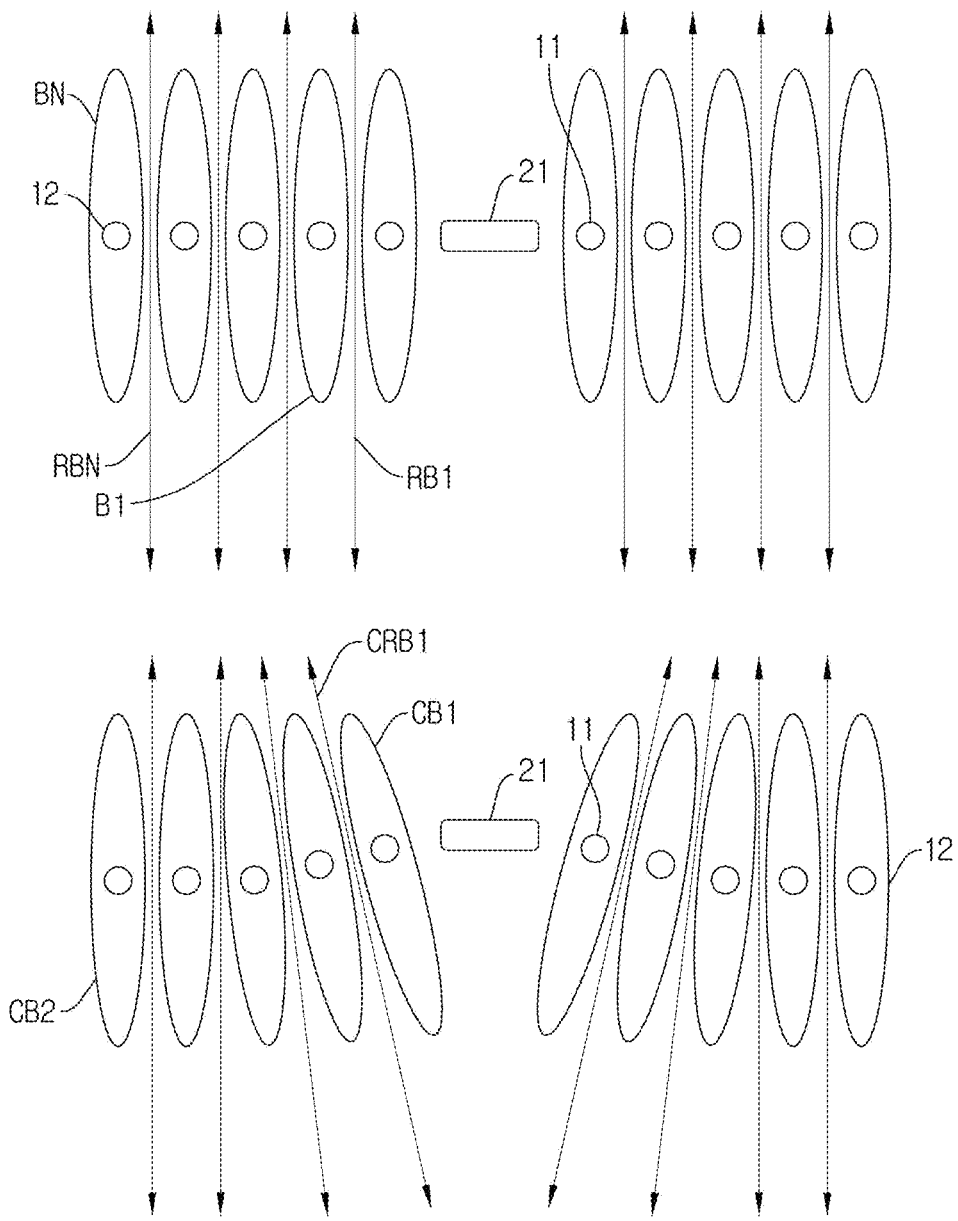
FIG. 4 shows an exemplary embodiment adjusting a magnetic field by the plasma source coil according to the present invention.

FIG. 4 shows an exemplary embodiment adjusting a magnetic field by the plasma source coil according to the present invention.

Referring to FIG. 4, an magnetic field B1 to BN may be induced by each spiral turn of the central coil 11 and the edge coil 12, and an inducing magnetic field RB1 to RBN for generating a plasma may be formed by the magnetic field B1 to BN. If the central coil 11 or the edge coil 12 is not adjusted, then the no magnetic field or weak magnetic field may be induced under the central part where the bushing 21 is displaced. Hence, the plasma density may be lower at the central part of the wafer located under the bushing 21 to increase a defect rate of the wafer process. To solve the plasma density irregularity on the wafer surface, the tilting level of the central coil 11 may be adjusted to form a corrected magnetic field CB1 to CBN, resulting to formation of a corrected induced magnetic field CRB1 to CRBN. The plasma density at the central part of the wafer, together at the peripheral part of the wafer may be changed by the corrected induced magnetic field CRB1 to CRBN to form an uniform plasma density on the whole wafer surface. If necessary, the separating distance between coil branches of the central coil 11 or the edge coil 12 or the extending direction may be adjusted for forming the uniform plasma density. The central coil 11 or the edge coil 12 may be adjusted in various ways, not limited to.

Figure 5:
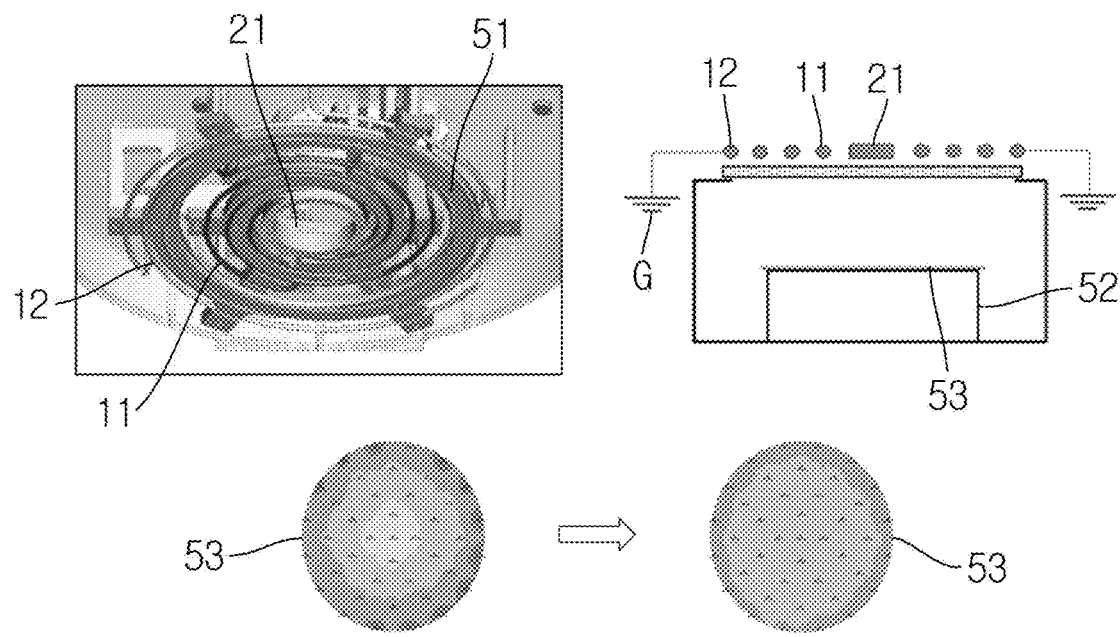
FIG. 5 shows an exemplary embodiment for applying the plasm source coil according to the present invention.

FIG. 5 shows an exemplary embodiment for applying the plasm source coil according to the present invention.

Referring to FIG. 5, the plasma source coil may be placed at a fixing board 51 arranged above a process chamber to generate a plasma within the process chamber. An electrostatic chuck 52 may be installed within the process chamber to fix a process substrate 53 such as a wafer. One end of the plasma source coil may be grounded G. the plasma source coil may generate a plasma by applying a RF power. As shown in the left below part of FIG. 5, if the central coil 11 or the edge coil 12 is not adjusted, then the plasma density distribution on the substrate surface is not even. For example, the plasma density on the central part of the process substrate 53 located under the bushing 21 may be lower than that of the other part of the process substrate 53. And the plasma density glows higher, as goes outward from the central part. Hence, an processing clearance may occur to become a processing error. As mentioned above, the geometric structure of the central coil 11 or the edge coil 12 may be adjusted to form an uniform plasma density on the substrate surface 53 such as the wafer as a whole, as shown in the right below of FIG. 5. Therefore, some occurrence of processing error due to the non-uniform plasma density can be prevented.

Figure 6:
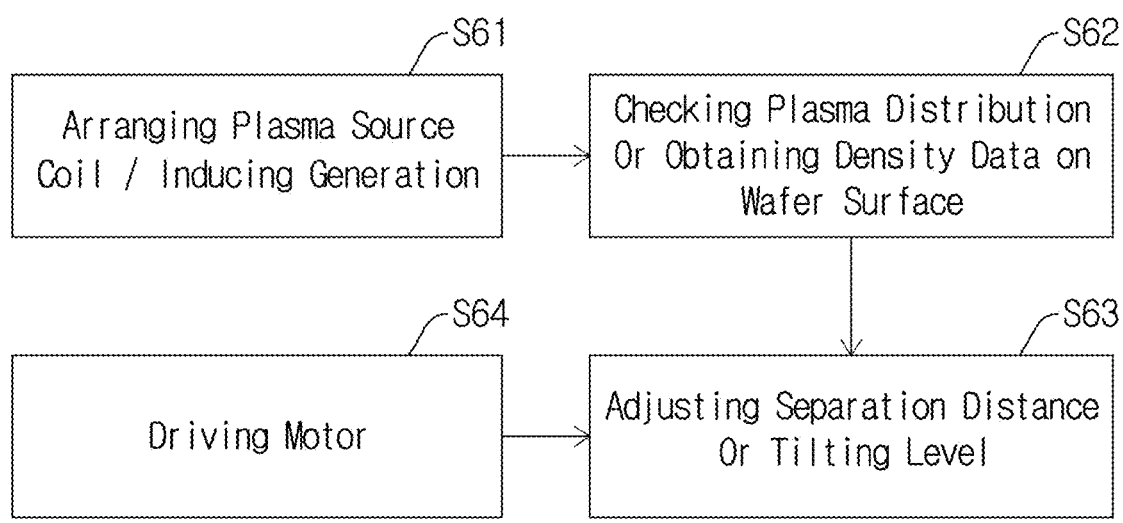
FIG. 6 shows an exemplary embodiment of a method for adjusting a plasma source coil according to the present invention.

FIG. 6 shows an exemplary embodiment of a method for adjusting a plasma source coil according to the present invention.

Referring to FIG. 6, a method for adjusting a geometric structure of a plasma source coil comprises arranging a plasma source coil S61; detecting a plasma density generated the plasma source coil on a predetermined plane or obtaining a plasma density data on the plane S62; and adjusting a extending direction of at least one branch of the plasma source coil or a tilting level of the at least one branch based on the plasma density on the plane S63. In addition, the method further comprises driving a driving means for adjusting an extending direction or a tilting level. And the predetermined plane may be a wafer surface fixed in a processing chamber.

The plasma source coil may be displaced over the process chamber for processing the wafer S61, and the plasma source coil may comprise a plurality of coil branches. Each coil branch may extend along a spiral path, one coil branch may extend from one bushing location, while other coil branch may extend from other bushing location different from one bushing location. And also, the plurality of coil branches may consist of the central coil and the edge coil. The central coil and the edge coil may be adjusted independently. If an electric power is supplied to the plasma source coil, then a plasma may be generated or a magnetic field may be induced on a predetermined plane S61. When the plasma is generated, the plasma density distribution may be checked or the induced magnetic field may be detected on the plane such as the wafer surface fixed on the electrostatic chuck to obtain a plasma density data S62. The density uniform property on the plane may be evaluated, if necessary, the separating distance between the coil branches forming the plasma source coil, or the tilting level along the extending path of each coil branch may be adjusted S63. The driving means such as the motor may be driven for adjusting the distance or tiling level S64. For example, the rotating angle of the motor may be controlled for adjusting the tilting level precisely. As mentioned above, the coil branch may be adjusted in various ways, not limited to.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A structure variable type of a plasma source coil comprising:
   a plurality of coil branches extending in a spiral shape from a central part of the plasma source coil; and
   an adjusting guide corresponding to each of the coil branch, the adjusting guide extending in a spiral shape and having a contact point at which an end part of a corresponding coil branch contacts,
   wherein the contact point is configured to move along the adjusting guide, thereby an extending direction or a tilting level of the corresponding coil branch being able to be adjusted according to a position of the contact point.

* * * * *